United States Patent [19]
Pasquarella

[11] Patent Number: 4,513,345
[45] Date of Patent: Apr. 23, 1985

[54] CONTROL CIRCUIT FOR INDUCTIVE LOAD

[75] Inventor: Stephen T. Pasquarella, Rochester, N.Y.

[73] Assignee: Va. Inc., Rochester, N.Y.

[21] Appl. No.: 529,100

[22] Filed: Sep. 2, 1983

[51] Int. Cl.$^3$ ............................................. H01H 47/22
[52] U.S. Cl. .................................... 361/155; 361/152; 361/156
[58] Field of Search ............... 361/152, 154, 155, 156, 361/201; 354/234.1, 235.1

[56] References Cited

U.S. PATENT DOCUMENTS 3,265,938  8/1966  Daien .................................. 361/155
3,702,425  11/1972  Hoffmann et al. .................. 361/155

FOREIGN PATENT DOCUMENTS 72012   5/1980  Japan ................................. 361/154
68602   5/1980  Japan ................................. 361/154
790028  12/1980 U.S.S.R. ............................. 361/154
838764  6/1981  U.S.S.R. ............................. 361/154

Primary Examiner—Harry E. Moose, Jr.
Attorney, Agent, or Firm—Hoffman Stone

[57] ABSTRACT

A control circuit for an inductive load comprising a relatively large capacitor, means for charging it through an SCR, and means for discharging it through the inductive load for energizing the load and simultaneously inhibiting the SCR so long as the discharge path for the capacitor remains closed.

4 Claims, 1 Drawing Figure

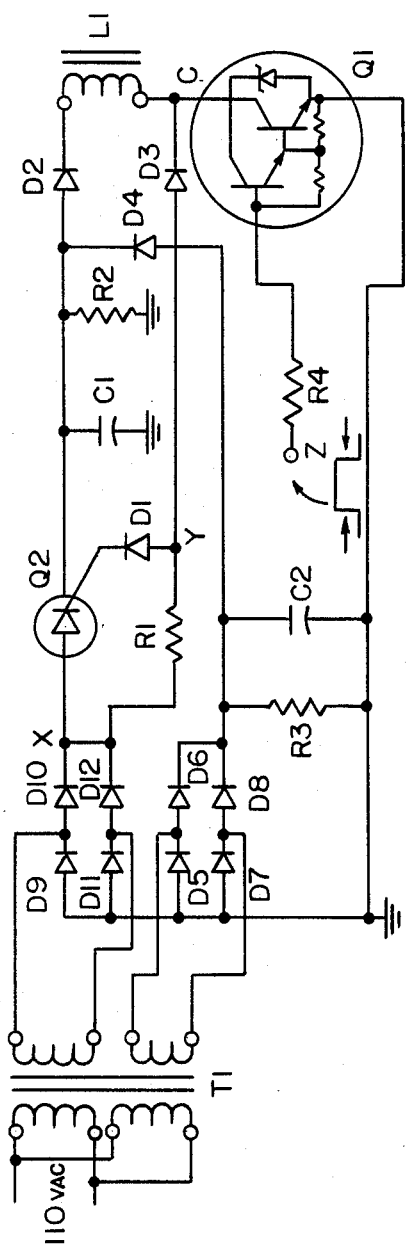

CONTROL CIRCUIT FOR INDUCTIVE LOAD

This invention relates to a novel control circuit for an inductive load. The circuit was devised as a result of efforts to avoid problems that were occasionally encountered in the control circuit previously used to operate a photographic shutter of the kind described in U.S. Pat. No. 3,664,251.

The circuit previously used included a main drive initiation capacitor connected to be continuously charged from a full wave rectifier. It was discharged for energizing the load through an SCR in series with the load. Problems were occasionally encountered when it was desired to energize the load repetitively at a relatively high rate. If the repetition rate was high enough the SCR would fail to cut off and the load would remain continuously energized at an undesirably high level.

BRIEF DESCRIPTION OF THE DRAWING

The sole FIGURE is a schematic diagram of the invention.

BRIEF DESCRIPTION

In the circuit of the invention the problem is overcome and positive cut off is provided for the SCR by connecting the SCR between the capacitor and the rectifier. The gate electrode of the SCR is connected to the output amplifier, or other type of switch, that controls the flow of current through the load so that for the duration of the input control signal the gate of the SCR is positively held below its trigger voltage. The output of the rectifier is not filtered so the SCR turns OFF at the first null in the output of the rectifier following initiation of the input control signal, and is held OFF until the end of the input control signal.

DETAILED DESCRIPTION

The presently preferred embodiment of the invention will now be described in detail in conjunction with the drawing, wherein the single FIGURE is a schematic diagram of the circuit.

The actuating coil L1 of the shutter is an inductive device, and to achieve a fast response for initiating operation it is necessary to impress a relatively high voltage across the coil for a fairly short interval, after which the coil may be held in its actuated position by a continuing voltage of a relatively low value. The initial high voltage gets the current flow started rapidly, and causes the actuator to start its travel quickly. The initiating voltage and current are provided by discharging the capacitor C1 which is normally charged to a voltage several times the normal rated voltage of the coil L1. When the capacitor C1 becomes discharged, an auxiliary circuit portion including the auxiliary rectifier D5-D8 provides sustaining current to hold the coil in its actuated position until the end of the triggering input signal. The voltage provided by the auxiliary circuit portion is well within the rated voltage of the coil L1. Thus the shutter (not shown) is made to respond quickly by the initial high voltage, and may be held operated as long as desired by the low sustaining voltage.

The input trigger signal is simply a square wave voltage that raises the potential at the input base electrode of the Darlington pair amplifier Q1 for an interval determined by the user. The Darlington Q1 acts simply as a switch. When the potential at its input Z is raised the Darlington Q1 turns ON, closing the path between its output collector and ground, and thereby completing the series circuit comprising the capacitor C1, the diode D2, and the coil L1. The capacitor then discharges through the coil.

When the Darlington Q1 is turned ON the potential at its output collector drops to a very low value, a value considerably below the trigger threshold of the SCR Q2. The trigger electrode of the SCR Q2 is connected through a diode D3 to the output collector of the Darlington pair Q1. When the voltage at the collector of the Darlington Q1 drops so also does the voltage at the gate electrode of the SCR, and the SCR Q2 turns off at the next null in the output of the unfiltered rectifier D9-D12. It is not triggered back ON until the Darlington Q1 turns OFF allowing the potential at the SCR gate electrode to rise toward the voltage at the output of the rectifier D9-D12, which happens because the gate is connected to the output of the rectifier through the resistor R1.

When the circuit is quiescent, i.e., during intervals between application of trigger signals at its input terminal Z, the SCR gate electrode remains at a fluctuating voltage, but always high enough to keep the SCR Q2 in its ON condition. Since the SCR Q2 is in simple series circuit between the rectifier D9-D12 and the initiating capacitor C1, the capacitor charges to approximately the peak voltage and the output of the rectifier, being able to discharge only through the resistor R2, which is of relatively high value.

A diode D1 is connected between the SCR gate electrode and the output collector of the Darlington Q1 to prevent the capacitor C1 from discharging through the gate electrode when the Darlington comes ON.

The diode D2 connected between the coil L1 and the capacitor C1 prevents alternating voltage at the SCR gate electrode from feeding back to the cathode of the SCR, which would prevent the SCR from turning ON. The diode D3 connected between the coil L1 and the SCR gate electrode blocks the surge voltage developed across the coil L1 when the Dralington Q1 turns OFF from appearing at the SCR gate. The Darlington Q1 includes the standard Zener diode (not separately referenced) for limiting the maximum value of the surge voltage that can develop across the coil L1 upon turn-off.

Sustaining current at relatively low voltage is provided by the auxiliary rectifier D5-D8, the output of which is fed to a relatively large capacitor C2 and to the coil L1 through the diode D2.

What is claimed is:

1. A control circuit for an inductive load comprising an initiating capacitor, switch means, means for connecting the capacitor and the switch means in series circuit with an inductive load, with the load being between the capacitor and the switch means, a rectifier, a triggerable avalanche device, means connecting the avalanche device between the rectifier and one terminal of the capacitor for charging the capacitor during times when the avalanche device is turned ON, and means connecting the gate electrode of the avalanche device to the switch means, the switch means being effective when in its closed condition to hold the gate electrode of the avalanche device at a voltage below the trigger voltage of the avalanche device.

2. A control circuit in accordance with claim 1 wherein the rectifier is unfiltered.

3. A control circuit in accordance with claim 1 including also a diode between the gate electrode and the switch means for blocking discharge of the capacitor through the avalanche device and its gate electrode.

4. A control circuit in accordance with claim 1 including an auxiliary rectifier parallelling said first named rectifier in series with the load for providing sustaining current to the load after said capacitor becomes fully discharged.

* * * * *